United States Patent
Buzzetti et al.

(10) Patent No.: US 11,676,752 B2
(45) Date of Patent: Jun. 13, 2023

(54) SYSTEMS AND METHODS TO SAFELY DISCHARGE INDUCTORS WITHOUT ENERGY LIMITATIONS

(71) Applicant: Maxim Integrated Products, Inc., San Jose, CA (US)

(72) Inventors: Siro Buzzetti, Arese Milan (IT); Danilo Ranieri, Rovello Porro (IT); Marco Pio Demicheli, Binago (IT)

(73) Assignee: Maxim Integrated Products, Inc., San Jose, CA (US)

( * ) Notice: Subject to any disclaimer, the term of this patent is extended or adjusted under 35 U.S.C. 154(b) by 305 days.

(21) Appl. No.: 17/166,144

(22) Filed: Feb. 3, 2021

(65) Prior Publication Data

US 2021/0304941 A1 Sep. 30, 2021

Related U.S. Application Data

(60) Provisional application No. 63/002,115, filed on Mar. 30, 2020.

(51) Int. Cl.
*H01F 13/00* (2006.01)
*H03K 17/687* (2006.01)
*H01F 7/06* (2006.01)

(52) U.S. Cl.
CPC ............ *H01F 13/006* (2013.01); *H01F 7/064* (2013.01); *H03K 17/6871* (2013.01)

(58) Field of Classification Search
CPC ...... H01F 7/064; H01F 7/1811; H01F 7/1844; H01F 13/006; H03K 17/0822; H03K 17/6871; H03K 2017/0806

(Continued)

(56) References Cited

U.S. PATENT DOCUMENTS 6,700,428 B2 3/2004 Sander
6,917,234 B2 7/2005 Horn et al.
(Continued)

FOREIGN PATENT DOCUMENTS

DE 102018205304 A1 * 11/2018 ............... H02M 1/08
JP 2005012809 A * 1/2005 ............ H01F 7/1811
WO WO-2005027326 A1 * 3/2005 ............... H02M 1/32

OTHER PUBLICATIONS

Machine Translation of Aoki et al. International Patent Document WO 200527326 A1 Mar. 24, 2005 (Year: 2005).*

(Continued)

*Primary Examiner* — Kevin J Comber
(74) *Attorney, Agent, or Firm* — North Weber & Baugh LLP; Michael North

(57) ABSTRACT

Embodiments of a discharge circuit are disclosed for quickly and safely discharging energy from an inductor load. The discharge circuit comprises a first switch, a second switch and a voltage regulator. The inductor load couples between the first switch and the second switch. During fast demagnetization, a high side switch is tuned off to decouple the load from a voltage source and the second switch is turned on. Voltage on one end of the load is pushed high and maintained at a predetermined level due to the voltage regulator. The predetermined voltage pulls down the current at the inductive load and causes temperature of the discharge circuit going up quickly. Once the temperature reaches a predetermined threshold, a comparing circuit outputs a signal to a driver and eventually pulls down voltage of the inductor load for low-power demagnetization.

19 Claims, 8 Drawing Sheets

(58) Field of Classification Search
USPC ........................................................ 361/149
See application file for complete search history.

(56) References Cited

U.S. PATENT DOCUMENTS

| | | | |
|---|---|---|---|
| 8,289,669 | B2 | 10/2012 | Nakahara |
| 8,985,850 | B1 | 3/2015 | Godbole et al. |
| 9,673,007 | B2 | 6/2017 | Buzzetti et al. |
| 10,009,021 | B1* | 6/2018 | Buzzetti ............... H03K 17/145 |
| 10,581,241 | B2 | 3/2020 | Lofthouse et al. |
| 11,101,729 | B1* | 8/2021 | Ortiz-Aguilar ......... H02M 1/32 |
| 2010/0134941 | A1* | 6/2010 | Nakahara ........... H03K 17/0822 |
| | | | 361/91.1 |
| 2017/0278659 | A1 | 9/2017 | Buzzetti et al. |

OTHER PUBLICATIONS

Machine Translation of Chang et al. German Patent Document DE 102018205304 A1 Nov. 29, 2018 (Year: 2018).*
Machine Translation of De Giacomo et al. Japanese Patent Document JP 2005012809 A Jan. 13, 2005 (Year: 2005).*

* cited by examiner

700

SYSTEMS AND METHODS TO SAFELY DISCHARGE INDUCTORS WITHOUT ENERGY LIMITATIONS

CROSS REFERENCE TO RELATED APPLICATION

The application claims priority to Provisional Application Ser. No. 63/002,115, entitled "SYSTEMS AND METHODS TO SAFELY DISCHARGE INDUCTORS WITHOUT ENERGY LIMITATIONS", filed on Mar. 30, 2020, and listing Siro Buzzetti, Danilo Ranieri, and Marco Pio Demicheli as the inventors. The aforementioned patent document is incorporated by reference herein in its entirety.

BACKGROUND

A. Technical Field

The present invention relates generally to systems and methods for discharging energy from an inductor.

B. Background of the Invention

One application of industrial motor control is to drive the coil of a motor brake. In order to quickly stop the motor, the brake inductor has to be demagnetized (transition the coil current to zero) as fast as possible. This process implies large power dissipation in the driving circuit exposing the latter to possible reliability issues.

During fast demagnetization, a discharge circuit comprising multiple switches generates thermal power in a short time. As a consequence, temperature of the discharge circuit goes up quickly and may cause damage to the circuit. Unfortunately, the coil current cannot be stopped while it is flowing. Therefore, the switches need to rely solely upon the power dissipation capability of an IC package of the discharge circuit to maintain the temperature of the IC until the coil is completely discharged. Above a certain energy level (depending on the size of the electromagnetic relay and on the initial current), the high-side switch may eventually fail and be permanently damaged.

Accordingly, it would be desirable to have systems and methods for quickly and safely discharging energy from an inductor.

SUMMARY OF THE INVENTION

Embodiments of the invention relate to systems and methods for quickly and safely discharging energy from an inductor.

In one or more embodiments, a discharge circuit comprising a first discharge switch (also referred as a first switch) $M_{LS1}$, a second discharge switch (also referred as a second switch) $M_{LS2}$ is disclosed to discharge an inductive load. The inductive load has a first end coupled to a voltage supply $V_{DD}$ via a high side switch $M_{HS}$. The first discharge switch $M_{LS1}$ and the second discharge switch $M_{LS2}$ may be an N-type metal-oxide-semiconductor (NMOS) transistor incorporated with a diode with the diode anode connected to the source terminal of the transistor and the diode cathode connected to the drain terminal of the transistor. A first terminal of the second discharge switch $M_{LS2}$ couples to the first end of the inductive load at an OUT node. A second terminal of the second discharge switch $M_{LS2}$ is grounded. A second end of the load couples to both a first terminal of the first discharge switch $M_{LS1}$ and a cathode of a Zener diode. A second terminal of the first discharge switch $M_{LS1}$ is grounded. The Zener diode has an anode coupled to the control terminal of the first discharge switch $M_{LS1}$. In one or more embodiments, the Zener diode couples to the control terminal of the first discharge switch $M_{LS1}$ via a series diode, which has opposite polarity to the Zener diode.

In one or more embodiments, a temperature sensor is placed in proximity of the first discharge switch $M_{LS1}$ to sense a temperature of the first discharge switch $M_{LS1}$. A comparing circuit receives a reference temperature signal $T_{PROTECTION}$ and a sensed temperature signal $T_{MLS1}$ from the temperature sensor. An output of the comparing circuit is fed to a driver circuit coupled to the control gate of the first discharge switch $M_{LS1}$ for ON/OFF control of the first discharge switch $M_{LS1}$. Once the temperature of the first discharge switch $M_{LS1}$ reaches $T_{PROTECTION}$, operation of the discharge circuit transitions to a safe demagnetization mode.

In one or more embodiments, a clamp may be formed by the first discharge switch $M_{LS1}$, the Zener diode, and the temperature sensor during fast demagnetization. The high side switch $M_{HS}$ is tuned off and the second discharge switch $M_{LS2}$ is turned on to initiate demagnetization. Since the inductor current cannot be stopped while it is flowing, a current path is formed through the second discharge switch $M_{LS2}$, the inductive load, and the first discharge switch $M_{LS1}$. Given the initial current flow of the load and second discharge switch $M_{LS2}$ switch on, the potential of the OUT node is pulled down to near zero, e.g., −0.1V. The potential on the second terminal is pushed high and maintained at a predetermined level (e.g., 52V) due to the Zener diode. Such a predetermined voltage pulls down the current at the inductive load quickly and thus fast demagnetization is achieved. At the same time, given the predetermined voltage applied on the first discharge switch $M_{LS1}$ and the initial current, the initial power dissipation for the first discharge switch $M_{LS1}$ is high enough to causes the temperature of $M_{LS1}$ going up quickly.

In one or more embodiments, once the temperature of the first discharge switch $M_{LS1}$ reaches $T_{PROTECTION}$, the comparing circuit generates a high output. Upon receiving the high output, a driver circuit pushes the control gate of the first discharge switch $M_{LS1}$ to a high level (e.g., 5V), which causes the voltage across the Zener diode below its Zener voltage and therefore pulls down the voltage level at the first terminal of the first discharge switch $M_{LS1}$ to a level (e.g., 0.1V) much less than the predetermined level. During the safe demagnetization, a current through the first discharge switch $M_{LS1}$ may also be at a much less value since the current in the inductive load has been pulled down during the fast demagnetization. Given a much less voltage level at the first terminal at the switch $M_{LS1}$, power dissipation for the switch $M_{LS1}$ during the safe demagnetization is significantly less, therefore, the temperature of the switch $M_{LS1}$ decreases.

In one or more embodiments, the comparing circuit uses hysteresis. Once the temperature of the switch $M_{LS1}$ decreases below $T_{PROTECTION}$ by a hysteresis amount, the discharge circuit returns to fast demagnetization.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Figure 1A:
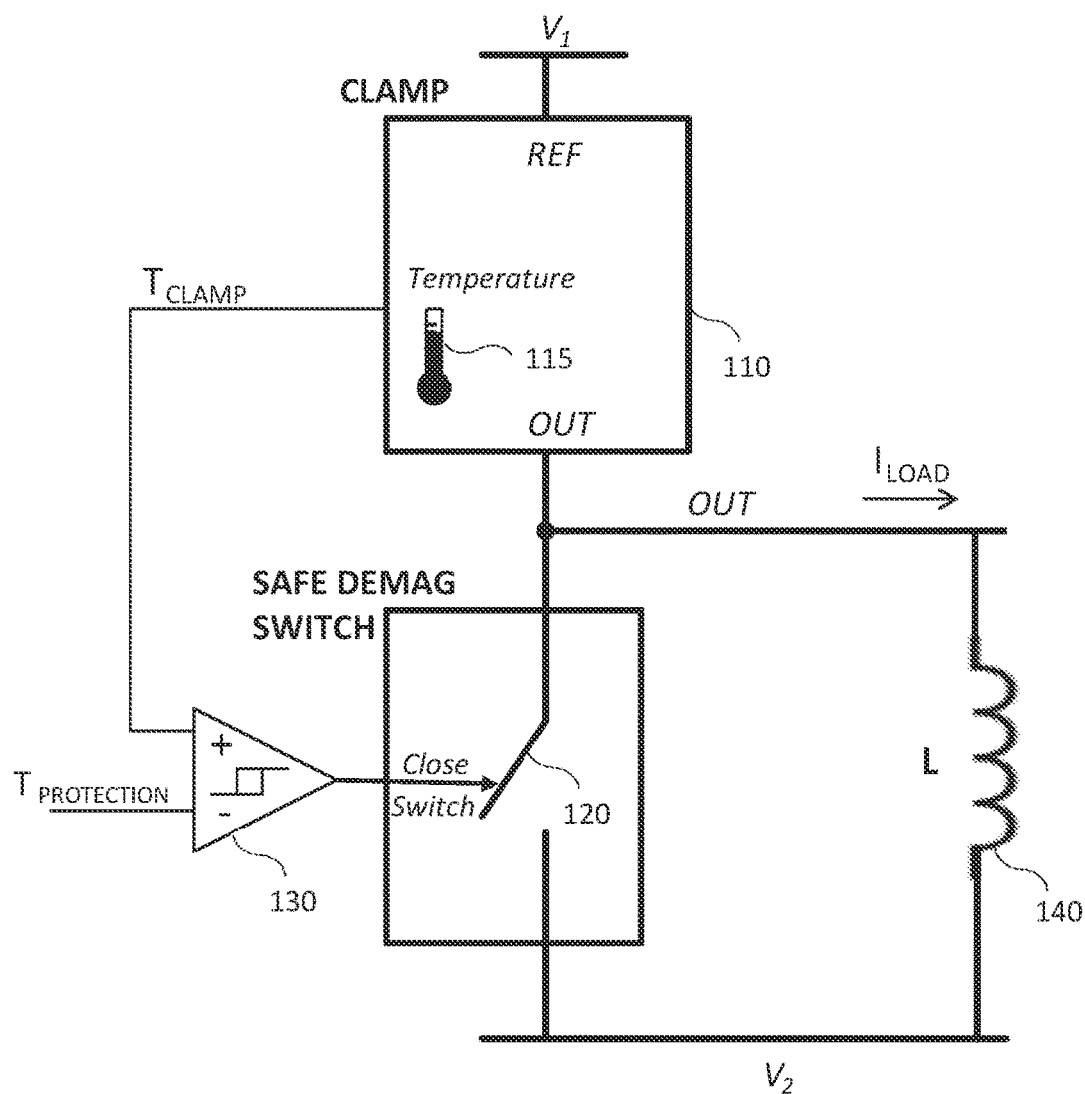
FIG. 1A depicts an electrical schematic and functional block diagram of a prior art discharge circuit comprising separate clamp and switch devices for an inductor.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. The terms "include," "including," "comprise," and "comprising" shall be understood to be open terms and any lists the follow are examples and not meant to be limited to the listed items.

Furthermore, one skilled in the art shall recognize that: (1) certain steps may optionally be performed; (2) steps may not be limited to the specific order set forth herein; (3) certain steps may be performed in different orders; and (4) certain steps may be done concurrently.

FIG. 1A depicts an electrical schematic and functional block diagram of a prior art discharge circuit 100 comprising separate clamp 110 and safe demagnetization switch 120 for an inductive load 140. The safe demagnetization switch 120 enables a low-power path only when the die temperature ($T_{CLAMP}$ monitored by a temperature sensor 115) has reached a predetermined level during an inductor demagnetization process. A comparing circuit 130 compares the die temperature $T_{CLAMP}$ to a signal $T_{PROTECTION}$ presenting the predetermined temperature level and outputs a signal, when $T_{CLAMP}$ is larger than $T_{PROTECTION}$, to close the safe demagnetization switch 120 for low-power demagnetization.

Figure 1B:
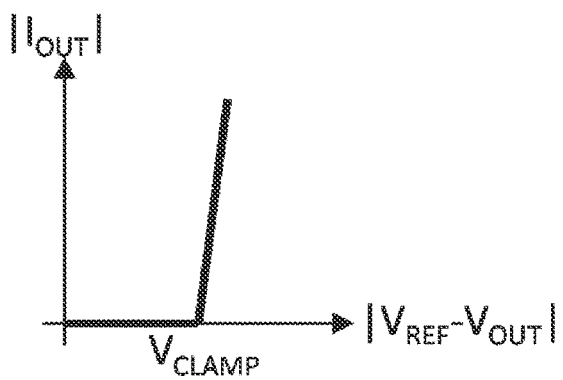
FIG. 1B depicts a current-voltage function of the clamp of the prior art discharge circuit.

FIG. 1B depicts a current-voltage function of the clamp of the art discharge circuit. The clamp current/voltage characteristics are shown as a function of $|V_{REF}-V_{OUT}|$. The clamp circuit starts providing current $|I_{OUT}|$ when the difference $|V_{REF}-V_{OUT}|$ increases above the clamp voltage. In one or more embodiments, the clamp voltage is 50V, although other values may also be used. The clamp and the switch may be made by the same transistors. During the clamp phase (or a high power demagnetization phase), the voltage drops mainly across the clamp, thus the power is dissipated mainly by clamp 110.

Figure 2:
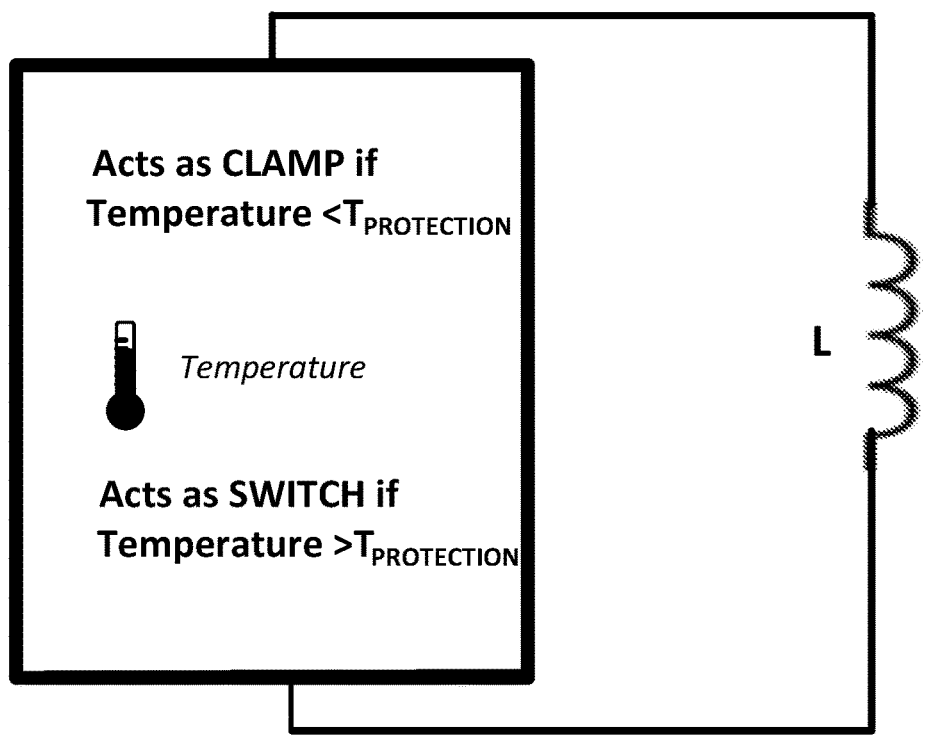
FIG. 2 depicts an exemplary block diagram with a clamp and a switch integrated as one device according to various embodiments of the invention.

The separation of the clamp and the safe demagnetization switch may bring some issues, including higher cost associated with separate IC packages, challenges for applications with size limitations, communication interference between the ICs, etc. Therefore, it would be desirable to integrate the clamp and the safe demagnetization switch together in one IC, or as a single element, as shown in FIG. 2, for compact circuit layout, lower cost, and/or improved adaptability for certain applications. In FIG. 2, a clamp, a switch and a temperature sensor are all integrated in one IC package to act as a clamp for fast (or high power) demagnetization of an inductive load L when the temperature of the IC package is lower than the predetermined temperature, or act as a switch for safe (or low power) demagnetization of the inductive load L when the temperature of the IC package is higher than the predetermined temperature.

Figure 3:
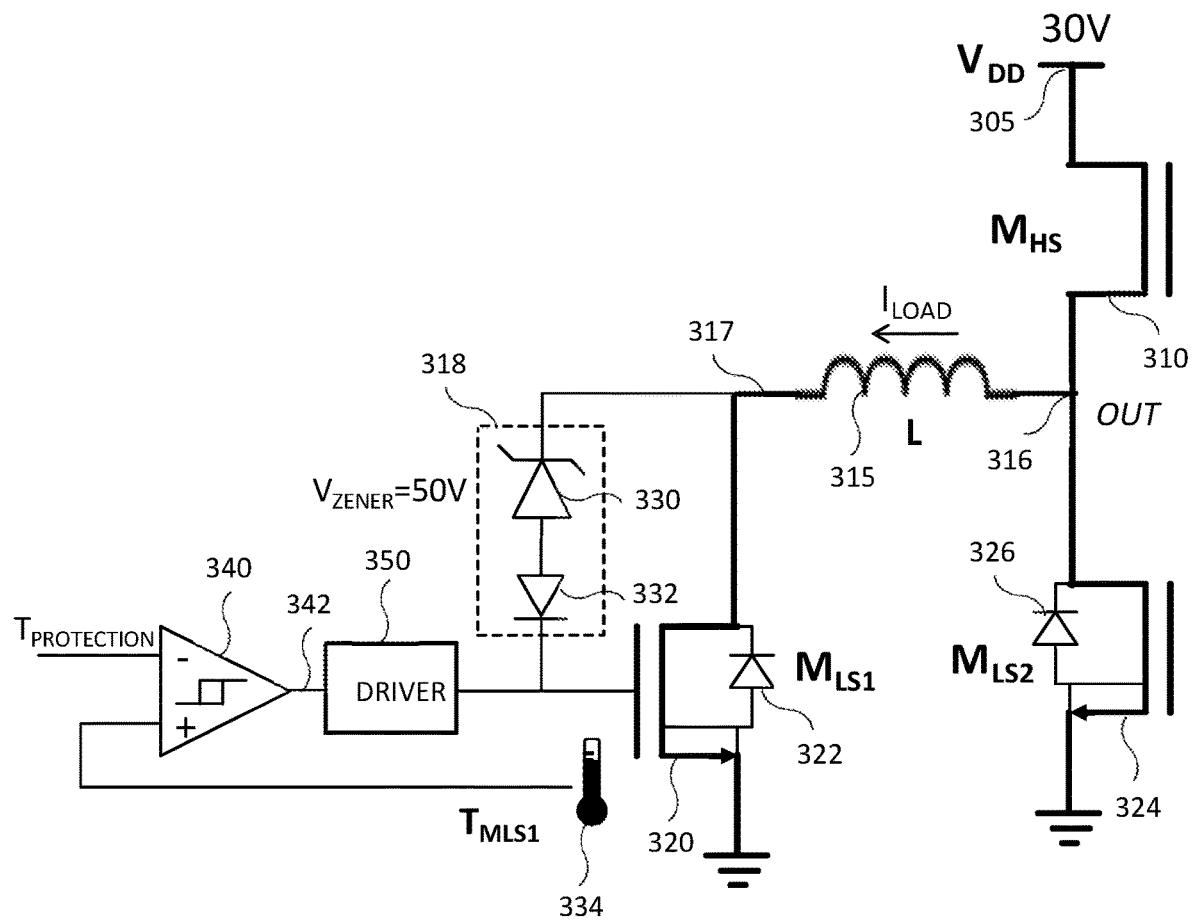
FIG. 3 depicts an electrical schematic of a discharge circuit with clamp and switch integration according to various embodiments of the invention.

FIG. 3 depicts an electrical schematic of a discharge circuit 300 with clamp and switch integration to discharge an inductive load according to various embodiments of the invention. The discharge circuit 300 comprises a first discharge switch $M_{LS1}$ 320 including a first terminal, a second terminal and a control terminal, and a second discharge switch $M_{LS2}$ 324 including a first terminal, a second terminal and a control terminal. In one or more embodiments, the first discharge switch $M_{LS1}$ 320 is an N-type MOS transistor incorporated with a body drain diode 322 with the diode anode connected to the source terminal of the transistor and the diode cathode connected to the drain terminal of the transistor. The second discharge switch $M_{LS2}$ 324 is an N-type MOS transistor incorporated with a body drain diode 326 with the diode anode connected to the source terminal of the transistor and the diode cathode connected to the drain terminal of the transistor.

In one or more embodiments, the inductive load 315 couples to a voltage source $V_{DD}$ 305 via a high side switch $M_{HS}$ 310 including a first terminal, a second terminal and a control terminal. The first terminal of the high side switch $M_{HS}$ 310 couples to the voltage supply $V_{DD}$, which may be at a voltage level of 30V. The second terminal of the high side switch $M_{HS}$ couples to both a first end of an inductive load 315 at a node 316 (OUT) and to the first terminal of the second discharge switch $M_{LS2}$. A second terminal of the second discharge switch $M_{LS2}$ is grounded. The second end 317 of the load couples to the first terminal of the first discharge switch $M_{LS1}$ 320. A voltage regulator 318 couples between the second end 317 and the control gate of the first discharge switch $M_{LS1}$ 320. The voltage regulator 318 behaves as an open circuit or does not allow current passing through it when the voltage across it is below a predetermined value and allows current passing through when the voltage reaches or is above the predetermined value.

In one or more embodiment, the voltage regulator 318 comprises a Zener diode 330 and a series diode 332 with opposite polarity to the Zener diode 330. The Zener diode 330 has a cathode coupled to the second end 317 of the load. The series diode 332 has a cathode coupled to the control terminal of the first discharge switch $M_{LS1}$ 320. By coupling the cathode of the Zener diode 330 with the load, induced voltage result from current change at the load may be more accurately reflected at the cathode of the Zener diode 330 to the inductive load 315 with minimum distortion or delay compared to alternative implementations with intermediate component(s) between the Zener diode and the load. The second terminal of the first discharge switch $M_{LS1}$ 320 is grounded.

In one or more embodiment, a temperature sensor 334 is placed in proximity of the first discharge switch $M_{LS1}$ 320 to sense a temperature of the first discharge switch $M_{LS1}$ 320. A comparing circuit 340 receives a reference temperature signal $T_{PROTECTION}$ at a negative input and a sensed temperature signal $T_{MLS1}$ from the temperature sensor 340 at a positive input. In one or more embodiments, the comparing circuit 340 uses hysteresis. An output 342 of the comparing circuit 340 is fed to a driver circuit 350. The driver circuit 350 couples to the control gate of the first discharge switch $M_{LS1}$ 320 for ON/OFF control of the first discharge switch $M_{LS1}$.

During fast demagnetization, a clamp may be formed by the first discharge switch $M_{LS1}$, the Zener diode, and the temperature sensor. During safe demagnetization, the safe demagnetization switch is implemented by the first discharge switch $M_{LS1}$ and the second discharge switch $M_{LS2}$. Details of the fast demagnetization and safe demagnetization are described with respect to FIG. 5 and FIG. 6 respectively.

Figure 4:
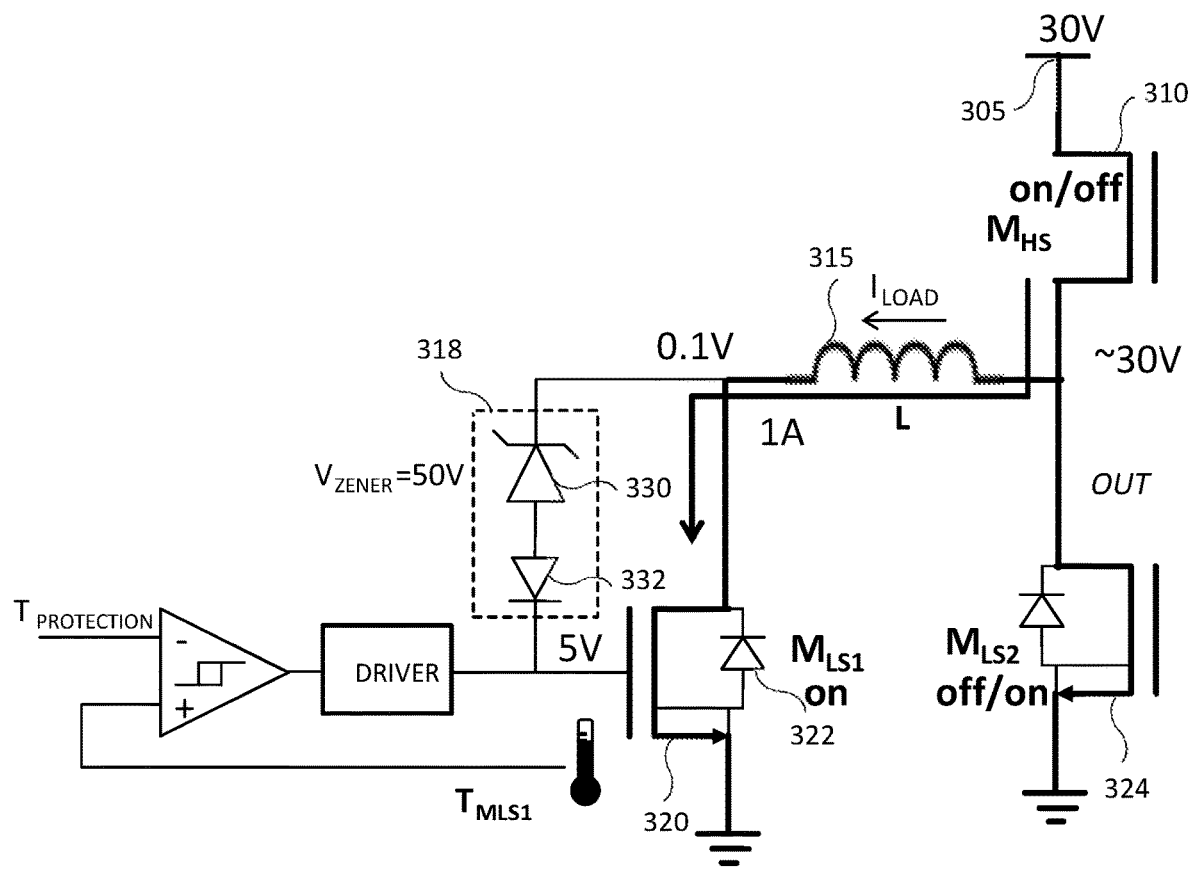
FIG. 4 depicts an on-phase operation of the discharge circuit with clamp and switch integration according to various embodiments of the invention.

Referring now to FIG. 4 for an on-phase operation of the discharge circuit 300 according to various embodiments of the invention, the second discharge switch $M_{LS2}$ is initially turned off, the high side switch $M_{HS}$ and the first discharge switch $M_{LS1}$ are turned on to enable a current (e.g., 1 A) through the inductive load 315. Little power is dissipated inside the die due to the low on-resistance of $M_{LS1}$ (e.g., $R_{MLS1}$=0.1Ω), a state when the switch $M_{LS1}$ is switched on by a high output (e.g., 5V) at the control gate as shown in FIG. 4. In one or more embodiments, during the ON phase, the first discharge switch $M_{LS1}$ is actively turned on through the driver independently from the comparator 340. In one or more embodiments, the high side switch $M_{HS}$ may be a P- or N-type transistor controlled with pulse width modulation (PWM) in junction with the second discharge switch $M_{LS2}$.

Figure 5:
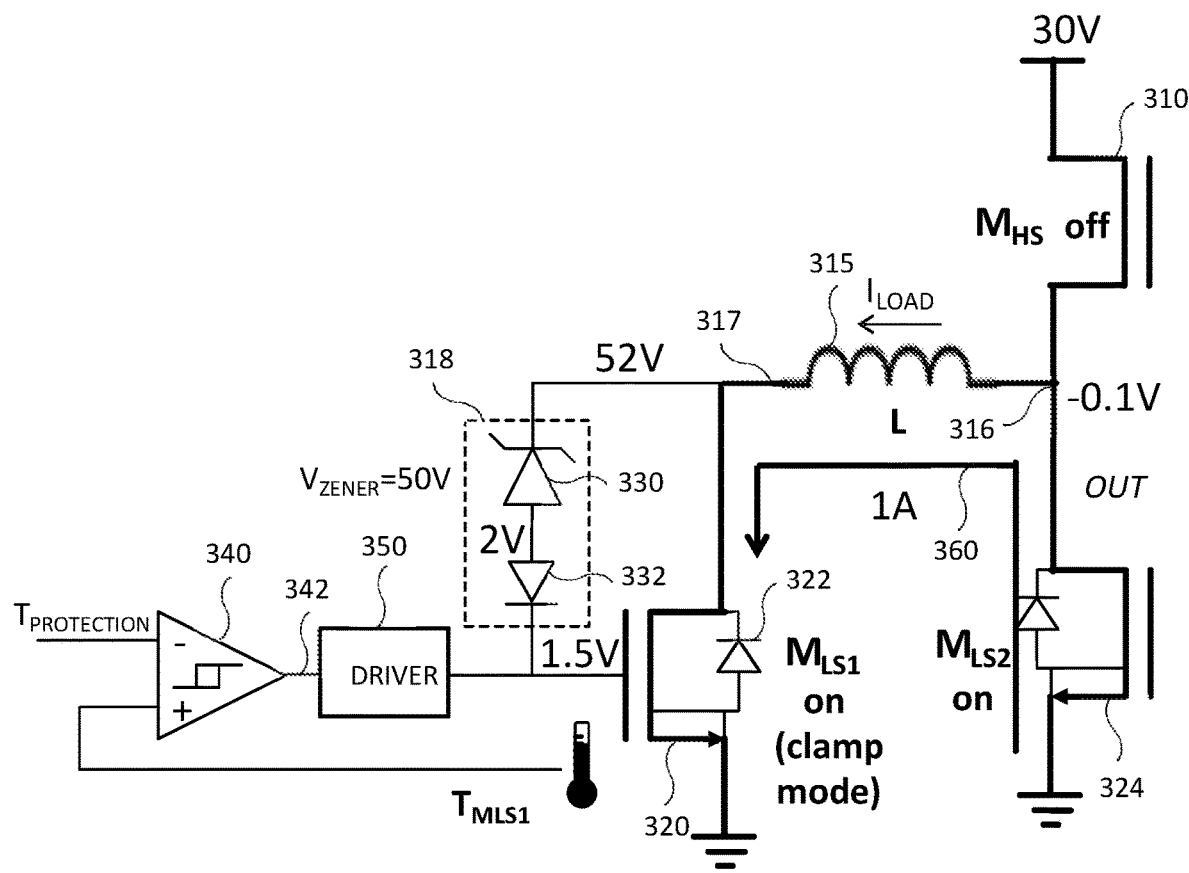
FIG. 5 depicts a fast demagnetization operation of the discharge circuit with clamp and switch integration according to various embodiments of the invention.

Referring now to FIG. 5, during a fast demagnetization operation of the discharge circuit 300, the high side switch $M_{HS}$ 310 is tuned off and the second discharge switch $M_{LS2}$ 324 is turned on. The first discharge switch $M_{LS1}$ 320 is turned off initially in the beginning of the fast demagnetization. The current at the inductive load is assumed as 1 A when the demagnetization starts. Since the inductor current cannot be stopped while it is flowing, with the initial 1 A current and current flow through the second discharge switch $M_{LS2}$ 324, the node OUT 316 (first end of the load) has a potential pulled from around 30V as shown in FIG. 4 to −0.1V (assuming $R_{MLS2}$=0.1Ω, $V_{OUT}$=0−0.1Ω×1 A=−0.1V).

However, with the decreasing tendency of the current flow, the inductive load generates an inductive potential across the load. Since the potential of the first end 316 is fixed at −0.1V after the second discharge switch $M_{LS2}$ 324 switched on, the potential on the second end 317 is pushed high immediately. Once the potential at the second end 317 is beyond a predetermined level of the voltage regulator 318 (e.g., a sum of the breakdown voltage or Zener voltage of the Zener diode 330, voltage drop on diode 332, and the voltage VGS of the transistor 320), the Zener diode 330 starts to conduct current, which flows through diode 332 and in turns pulls-up the gate of first discharge switch $M_{LS1}$ 320. Once the gate-source voltage of the first discharge switch $M_{LS1}$ 320 reaches the threshold voltage of the FET (e.g., 1.5V), the first discharge switch $M_{LS1}$ 320 starts to conduct current $I_{LOAD}$, thus stopping voltage at the second end 317 from raising further. The threshold voltage of the FET is the minimum gate-to-source voltage VGS needed to create a conducting current path between the source and drain terminals of the FET. A current path 360 is therefore formed through the second discharge switch $M_{LS2}$ 324, the inductive load 315, and the first discharge switch $M_{LS1}$ 320.

The potential at the second end 317 is maintained at the predetermined level, which may be determined by the choosing desired Zener diode, series diode and transistor. Furthermore, the diode 322 incorporated with the first discharge switch $M_{LS1}$ 320 has its anode coupled to the second end 317. Such an arrangement also ensures that the potential at the second end 317 is maintained at the predetermined level during the fast demagnetization. For the embodiment shown in FIG. 4, the Zener voltage of the Zener diode is 50V. Assuming a gate-source voltage 1.5V required to have 1 A flowing through the switch $M_{LS1}$ and a 0.5V forward bias voltage for the diode 332, the predetermined level is set at 52V. Such a 52V voltage applied on the second end 317 pulls down the current at the inductive load quickly and thus fast demagnetization is achieved.

At the same time, given the 52V voltage on the first terminal of the first discharge switch $M_{LS1}$ 320 and the 1 A initial current, the initial power dissipation for the first discharge switch $M_{LS1}$ 320 is $P_{MLS1}$=52V×1 A=52 W. Such high power dissipation causes the temperature of $M_{LS1}$ 320 going up quickly.

In one or more embodiment, the temperature of $M_{LS1}$ 320 is monitored by a temperature sensor integrated within the same IC package for the discharge circuit and placed in proximity of the first discharge switch $M_{LS1}$ 320. Once the temperature of the first discharge switch $M_{LS1}$ reaches $T_{PROTECTION}$, operation of the discharge circuit transitions to the safe demagnetization mode.

Figure 6:
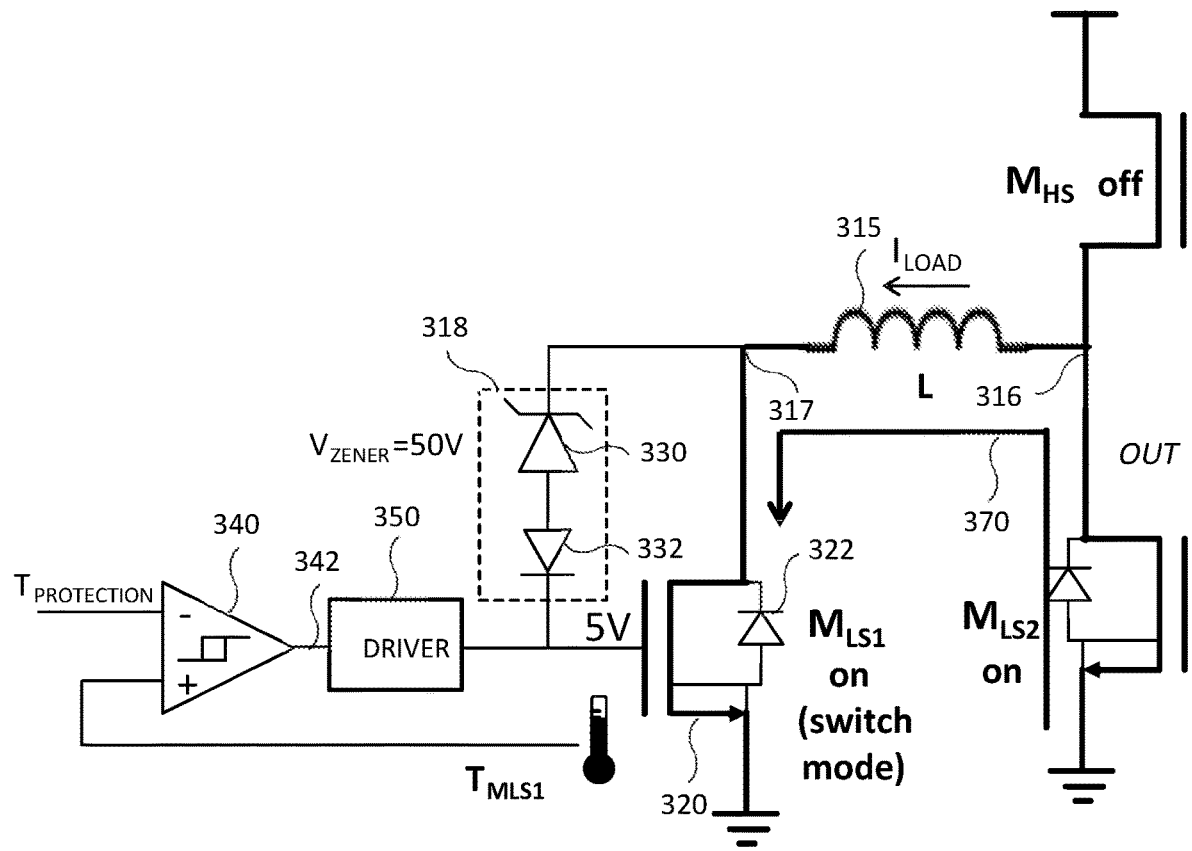
FIG. 6 depicts a safe demagnetization operation of the discharge circuit with clamp and switch integration according to various embodiments of the invention.

FIG. 6 depicts a safe demagnetization operation of the electrical schematic of the discharge circuit with clamp and switch integration according to various embodiments of the invention. The comparing circuit 340 receives a reference temperature signal $T_{PROTECTION}$ at a negative input and a sensed temperature signal $T_{MLS1}$ from the temperature sensor 340 at a positive input. In one or more embodiments, the comparing circuit 340 uses hysteresis. Upon the measured temperature $T_{MLS1}$ reaches $T_{PROTECTION}$, the comparing circuit 340 generates an output 342 to the driver circuit 350. In one or more embodiments, the output 342 is a high output when the measured temperature $T_{MLS1}$ reaches $T_{PROTECTION}$. Upon receiving the high output 342, the driver circuit 350 pushes the control gate of the first discharge switch $M_{LS1}$ 320 to a high level (e.g., 5V), which causes the voltage across the Zener diode 330 below its Zener voltage (e.g., 50V) and therefore pulls down the voltage level at the first terminal of the first discharge switch $M_{LS1}$ 320 to a level (e.g., 0.1V) much less than the predetermined level of 52V. During the safe demagnetization, a current path 370 is still through the second discharge switch $M_{LS2}$ 324, the inductive load 315, and the first discharge switch $M_{LS1}$ 320, but at a less value since the current in the inductive load has been pulled down during the fast demagnetization. The amount of current drop depends on how large the inductor is and how long the fast demagnetization lasts before the temperature rises to the threshold temperature. Given the decreased current through the switch $M_{LS1}$ 320 and a much reduced voltage level at the second end 317, power dissipation for the switch $M_{LS1}$ 320 during the safe demagnetization is significantly less, therefore, the temperature of the switch $M_{LS1}$ 320 decreases.

In one or more embodiments, the comparing circuit 340 uses hysteresis. Once the temperature of the switch $M_{LS1}$ 320 decreases below $T_{PROTECTION}$ by a hysteresis amount, comparing circuit 340 outputs a low signal to cause the switch $M_{LS1}$ 320 away from a low on-resistance (e.g., 0.1Ω) state, and thus the discharge circuit returns to the fast demagnetization.

Figure 7:
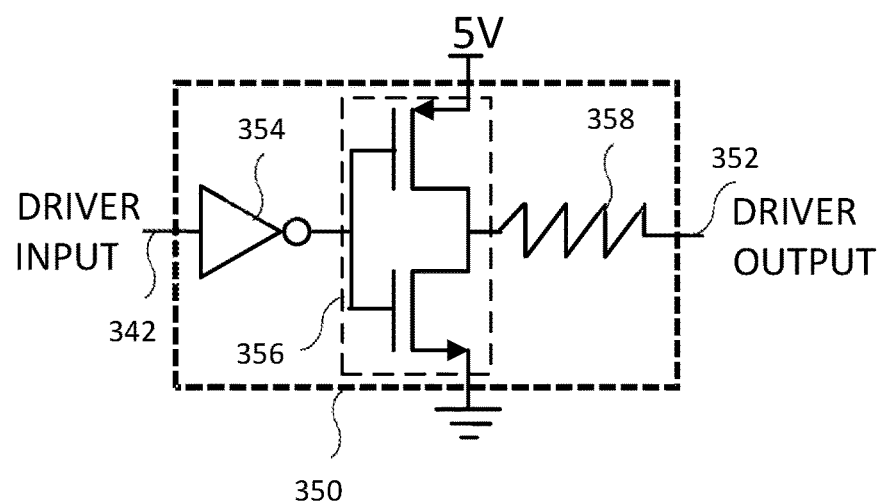
FIG. 7 depicts an exemplary driver circuit for driving a switch of the discharge circuit according to various embodiments of the invention.

FIG. 7 depicts an exemplary driver circuit for driving a switch of the discharge circuit according to various embodiments of the invention. The exemplary drive 350 comprises an inverter 354, a push-pull driver 356 having a P-channel and an N-channel complementary metal-oxide-semiconductor (CMOS) transistors, and a resistor 358 coupled in series. When the measured temperature $T_{MLS1}<T_{PROTECTION}$, the driver input 342 (from the comparing circuit 340) is low and the driver output 352 from the driver circuit 350 is low. During fast demagnetization, although the output of the push-pull driver is low, the gate of the switch $M_{LS1}$ is pulled up by the Zener diode and maintained at the desired voltage (e.g., 1.5V) due to the existence of the resistor 358. When the measured temperature $T_{MLS1}>T_{PROTECTION}$, the INPUT 342 from the comparing circuit 340 becomes high and the OUTPUT 352 from the driver circuit 350 transits to high also.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

The invention claimed is:

1. A discharge circuit for demagnetizing an inductive load, comprising:
    a first switch having a first terminal coupled to one end of the inductive load;
    a voltage regulator coupled between a control terminal of the first switch and the one end of the inductive load, the voltage regulator prevents current passing through when a voltage across the voltage regulator is less than a predetermined value;
    a second switch coupled to another end of the inductive load, upon being switched on, the second switch grounds the another end of the inductive load such that a voltage at the one end of the inductive load reaches or is above the predetermined value;
    a first temperature sensor that generates a sensed temperature signal based on a temperature of at least one component of the discharge circuit;
    a comparing circuit that receives a reference temperature signal representing a predetermined temperature and the sensed temperature signal and generates an output with respect to a comparison between the reference temperature signal and the sensed temperature signal; and
    a driver that receives the output from the comparing circuit and generates a driver output to the control terminal of the first switch, responsive to the output from the comparing circuit indicating that the temperature of the at least one component of the discharge circuit is above the predetermined temperature, the driver output switches on the first switch and causes the voltage across the voltage regulator below the predetermined value.

2. The discharge circuit of claim 1 wherein the discharge circuit is implemented as a single integrated circuit.

3. The discharge circuit of claim 1 wherein voltage regulator comprises a Zener diode and a series diode coupled in series, the Zener diode has a cathode coupled to the one end of the inductive load, the series diode has opposite polarity to the Zener diode.

4. The discharge circuit of claim 1 wherein the voltage across the voltage regulator is applied between the first terminal and the control terminal of the first switch.

5. The discharge circuit of claim 1 wherein the comparator has hysteresis, when the temperature of at least one component of the discharge circuit decreases below the predetermined temperature by a hysteresis amount, the driver output causes the first switch to be away from a low on-resistance state.

6. The discharge circuit of claim 1 wherein the driver comprises an inverter receiving the output of the comparing circuit, a push-pull driver comprising a P-channel complementary metal-oxide-semiconductor (CMOS) transistor and an N-channel CMOS transistor, and a resistor.

7. The discharge circuit of claim 1 wherein the first switch is an N-type metal-oxide-semiconductor (NMOS) transistor incorporated with a body drain diode with a diode anode connected to a source terminal of the NMOS transistor and a diode cathode connected to a drain terminal of the NMOS transistor.

8. A method for demagnetizing an inductive load, the method comprising:
coupling one end of the inductive load to a first terminal of a first switch, a voltage regulator coupled between a control terminal and the first terminal of the first switch, the voltage regulator prevents current passing through when a voltage across the voltage regulator is less than a predetermined value;
switching on a second switch, coupled to another end of the inductive load, to ground the another end of the inductive load such that a voltage at the one end of the inductive load is induced to reach or be above the predetermined value;
generating, using a temperature sensor placed in proximity of the first switch, a sensed temperature signal indicating a temperature of the first switch;
generating, using a comparison circuit, an output based on a comparison between the sensed temperature signal and a reference temperature signal representing a predetermined temperature; and
generating, using a driver coupled to the comparison circuit, a driver output to the control terminal of the first switch according to the output from the comparing circuit, responsive to the output from the comparing circuit indicating that the temperature of the first switch is above the predetermined temperature, the driver output switches on the first switch and causes the voltage across the voltage regulator below the predetermined value.

9. The method of claim 8 wherein voltage regulator comprises a Zener diode and a series diode coupled in series, the Zener diode has a cathode coupled to the one end of the inductive load, the series diode has opposite polarity to the Zener diode.

10. The method of claim 8 wherein the comparator has hysteresis, responsive to the output from the comparing circuit indicating that the temperature of the first switch is below the predetermined temperature by a hysteresis amount, the driver output causes the first switch to be away from a low on-resistance state.

11. The method of claim 8 wherein responsive to the output from the comparing circuit indicating that the temperature of the first switch is above the predetermined temperature, the driver output is a high level.

12. The method of claim 8 wherein the first switch is turned off initially to enable that the voltage at the one end of the inductive load is induced to reach or be above the predetermined value when the second switch is switch on to ground the one end of the inductive load.

13. The method of claim 8 wherein the first switch is an N-type metal-oxide-semiconductor (NMOS) transistor incorporated with a body drain diode with a diode anode connected to a source terminal of the NMOS transistor and a diode cathode connected to a drain terminal of the NMOS transistor.

14. A method for demagnetizing an inductive load, the method comprising:
decoupling, via a high side switch, one end of the inductive load from a voltage source;
coupling the one end of the inductive load to a first terminal of a first switch, a voltage regulator coupled between a control terminal and the first terminal of the first switch, the voltage regulator prevents current passing through when a voltage across the voltage regulator is less than a predetermined value, the first switch has a second terminal grounded;
switching on a second switch, coupled to another end of the inductive load, to ground the another end of the inductive load and switching off the first switch such that a voltage at the one end of the inductive load reaches or is above the predetermined value to allow current passing through the voltage regulator and pull-up the control terminal of first switch;
upon the control terminal of first switch reaching a threshold voltage, forming a current path through the second switch, the inductive load, and the first switch; and
responsive to demagnetization of the inductive load transitioning into a safe demagnetization mode, generating, using a driver, a driver output to the control terminal of the first switch to switch on the first switch and cause the voltage across the voltage regulator below the predetermined value.

15. The method of claim 14 wherein voltage regulator comprises a Zener diode and a series diode coupled in series, the Zener diode has a cathode coupled to the one end of the inductive load, the series diode has opposite polarity to the Zener diode.

16. The method of claim 14 wherein transitioning into the safe demagnetization mode comprising steps of:
generating, using a temperature sensor placed in proximity of the first switch, a sensed temperature signal indicating a temperature of the first switch;
generating, using a comparison circuit, an output based on a comparison between the from the sensed temperature signal and a reference temperature signal representing a predetermined temperature; and
responsive to the output from the comparing circuit indicating that the temperature of the first switch is above the predetermined temperature, transitioning into the safe demagnetization mode.

17. The method of claim 16 wherein in the safe demagnetization mode, the voltage at the one end of the inductive load is less than the predetermined value.

18. The method of claim 14 wherein the first switch is an N-type metal-oxide-semiconductor (NMOS) transistor incorporated with a body drain diode with a diode anode connected to a source terminal of the NMOS transistor and a diode cathode connected to a drain terminal of the NMOS transistor.

19. The method of claim 14 wherein the first switch is an N-type metal-oxide-semiconductor (NMOS) transistor, the threshold voltage is the minimum gate-to-source voltage needed to create a conducting current path between a source terminal and a drain terminal of the NMOS transistor.

\* \* \* \* \*